(12) United States Patent
Koseki et al.

(10) Patent No.: US 6,473,306 B2
(45) Date of Patent: Oct. 29, 2002

(54) HEAT SINK ASSEMBLY RETAINER FOR ELECTRONIC INTEGRATED CIRCUIT PACKAGE

(75) Inventors: Yoshitsugu Koseki, Nagono (JP); Hung-Ji Yu, Hsi-Chih (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/795,902

(22) Filed: Feb. 27, 2001

(65) Prior Publication Data

US 2002/0118513 A1 Aug. 29, 2002

(30) Foreign Application Priority Data

Jan. 4, 2001 (TW) ................................. 090200149 U

(51) Int. Cl.[7] .............................................. H05K 7/20
(52) U.S. Cl. ...................... 361/704; 165/80.3; 165/185; 248/510; 257/719; 257/722; 361/710; 361/719
(58) Field of Search .................. 24/295–296, 457–458, 24/573; 165/80.2, 80.3, 185; 174/16.3; 248/505, 510; 257/718–719, 722, 726–727; 361/704, 707, 710, 715, 719–720

(56) References Cited

U.S. PATENT DOCUMENTS

| | | | | |
|---|---|---|---|---|
| 5,477,916 A | * | 12/1995 | Lin | 165/80.3 |
| 5,493,475 A | * | 2/1996 | Lin | 361/710 |
| 5,648,890 A | * | 7/1997 | Loo et al. | 361/704 |
| 5,662,163 A | * | 9/1997 | Mira | 165/80.3 |
| 5,978,223 A | * | 11/1999 | Hamilton et al. | 361/704 |
| 6,055,159 A | * | 4/2000 | Sun | 361/704 |
| 6,191,480 B1 | * | 2/2001 | Kastberg et al. | 257/727 |

* cited by examiner

Primary Examiner—Gregory Thompson
(74) Attorney, Agent, or Firm—Wei Te Chung

(57) ABSTRACT

A retainer device (1) for fastening a heat sink (2) to a printed circuit board module (3). The heat sink comprises a base plate (22) and a plurality of upwardly extending fins (24). The retainer device comprises an operation lever (14), a fastening frame (12), and a backing plate (16) attached to a bottom surface of the module. Clasp hooks (162) of the backing plate hold the fastening frame in place. The fastening frame has pairs of pivot openings (129), cam plates (128), and cutouts (130). The operation lever includes an operational body (142), a pair of arms (144), a pair of U-shaped urging portions (146), and a pair of pivot axles (148) passing through the pivot openings. The operational body is rotated to make the urging portions pass around the cam plates into the cutouts. The heat sink is thereby pressed tightly against the printed circuit board module.

12 Claims, 9 Drawing Sheets

HEAT SINK ASSEMBLY RETAINER FOR ELECTRONIC INTEGRATED CIRCUIT PACKAGE

BACKGROUND OF THE INVENTION

1. Field of the Invention

The present invention relates to cooling of electronic assemblies, and more specifically to a heat sink assembly retainer for electronic components such as transistors, integrated circuits or the like which are mounted on a printed circuit board (PCB) of electronic devices.

2. Background of the Related Art

Since the successful introduction of integrated circuits (ICs), there has been a steady progression toward larger IC devices with capability for a greater number and scope of functions. Heat produced by these larger semiconductors devices is conventionally removed by heat sinks, which dissipate the heat through either natural air convection or by powered ventilation.

When attaching a heat sink to the heat-generating electronic device, it is usually not desirable to use bonding such as by way of adhesive. This is because of the permanency of such attachment. If a semiconductor device has to be discarded due to malfunction, it is not desirable to throw away the heat sink too. Thus it is generally desirable to attach a heat sink to a chip or device by mechanical means such as a retainer clip. Typical heat sinks currently in use comprise a flat plate generally the same size as the device, and a plurality of radiation fins extending upwardly from the flat plate. The heat sink is commonly manufactured by extrusion and subsequent machining.

A new development in the art of electronic packages for microprocessor semiconductor devices utilizes a cartridge, which contains a printed circuit board on which the microprocessor is mounted. The cartridge may be made of metal. At least one major microprocessor supplier has established a specification for the cartridge, which includes a thermal plate. To facilitate proper attachment of the heat sink to the cartridge thermal plate, the thermal plate is provided with multiple openings to permit engagement of retainer clips accompanying the heat sink.

A wide variety of heat sink assemblies and retainers are available. For example, the applicant's earlier U.S. Pat. No. 5,600,540 shows a heat sink and retainer for electronic integrated circuits comprising a two-piece retainer clip particularly adapted for use in connection with a semiconductor device mounted directly on a socket, which in turn is attached to a printed circuit board. Another device is shown in the applicant's earlier U.S. Pat. No. 5,208,731, which discloses a single-piece retainer, clips for a similar chip, a socket and a heat sink assembly. Another device is shown in U.S. Pat. No. 5,448,449. It has either one or two retainer clips for securing a heat sink to a semiconductor chip, which is mounted in a socket.

In all the above-described devices, laborious operation is required to properly attach the retainer clip and secure the heat sink to the semiconductor chip and/or socket. This significantly reduces the cost effectiveness of a retainer clip. It is also desired to have a retainer clip with positive and easily ascertainable engagement means. A retainer clip should only be able to exist in two states: attached or detached. If an intermediate state is permitted, the assembly may not be completely attached yet pass unnoticed by a user performing the attachment operation. If so, when the computer or other electronic device is shipped and subjected to various forces such as vibration, the retainer clip may be loosened and the heat sink may become disengaged. If the device continues to be subjected to rough handling during shipping, damage to other components within the electronic device may also result. A dislodged heat sink undetected by a user will likely result in the semiconductor device easily overheating and getting damaged or destroyed.

Another problem with conventional retainer clips again relates to rough handling that frequently occurs during shipping of electronic devices which contain a semiconductor device, heat sink and retainer clip. It is of course desirable that a retainer clip exerts a relatively uniform and large pressure on a heat sink, so that a lower flat base of the heat sink is in intimate thermal engagement with an upper surface of the chip or with a module plate (see above). This pressure creates frictional engagement between these two surfaces. However, a sharp blow coplanar with such surfaces can cause the heat sink to slide relative to the chip. The heat sink may strike the retainer clip assembly, causing the retainer clip to become dislodged and the heat sink to be separated from the chip. Even partial displacement of the heat sink base relative to the semiconductor device will affect the efficiency of heat transfer from the device to the heat sink.

SUMMARY OF THE INVENTION

Accordingly, an object of the present invention is to provide an improved retainer device for a heat sink assembly used for an electrical component mounted on a printed circuit board of an electronic device.

Another object is to provide a retainer device which is simple in construction, easy to use, efficient and effective in removing heat from the electrical component.

These and other objects can be achieved by a heat sink assembly retainer constructed according to the principles of the present invention and adapted to be mounted on a printed circuit board for dissipating heat from a heat-generating component of an electronic device. The heat sink assembly retainer comprises a retainer device for attachment of a heat sink to an electronic package or semiconductor device. The heat sink comprises a flat base with a plurality of upwardly extending fins. The fins are defined at least one channel. The retainer device comprises an operation lever, a fastening frame, and a backing plate with a plurality of upwardly extending clasp hooks. The backing plate is attached to a bottom surface of a motherboard of an integrated circuit module. The fastening frame is positioned around the periphery of the heat-dissipating device, and limits displacement of the heat sink. The clasp hooks of the backing plate hold the fastening frame in place. The fastening frame has pivot openings, cam plates, and cutouts at bottom portions of the cam plates. The operation lever includes an operational body a pair of arms, a pair of urging portions, and a pair of pivot axles passing through the pivot openings of the fastening frame. The operational body is rotated to make the urging portions pass around the cam plates until the urging portions are snapped into the cutouts. The fastening frame elastically deforms and causes the urging portions to press against the heat sink. The heat sink is thereby pressed tightly against the printed circuit board module.

BRIEF DESCRIPTION OF THE DRAWINGS

A more complete appreciation of the present invention, and many of the attendant advantages thereof, will become readily apparent by reference to the following detailed description of the preferred embodiment when considered in conjunction with the accompanying drawings in which like reference symbols indicate the same or similar components, wherein.

DETAILED DESCRIPTION OF THE PREFERRED EMBODIMENT

The present invention will be described in its preferred embodiment in conjunction with a heat sink and a printed circuit board module such as a CPU module. However, it should be understood that the described heat sink assembly retainer might also be used with other semiconductor devices mounted directly on a printed circuit board or a socket.

Figure 1:
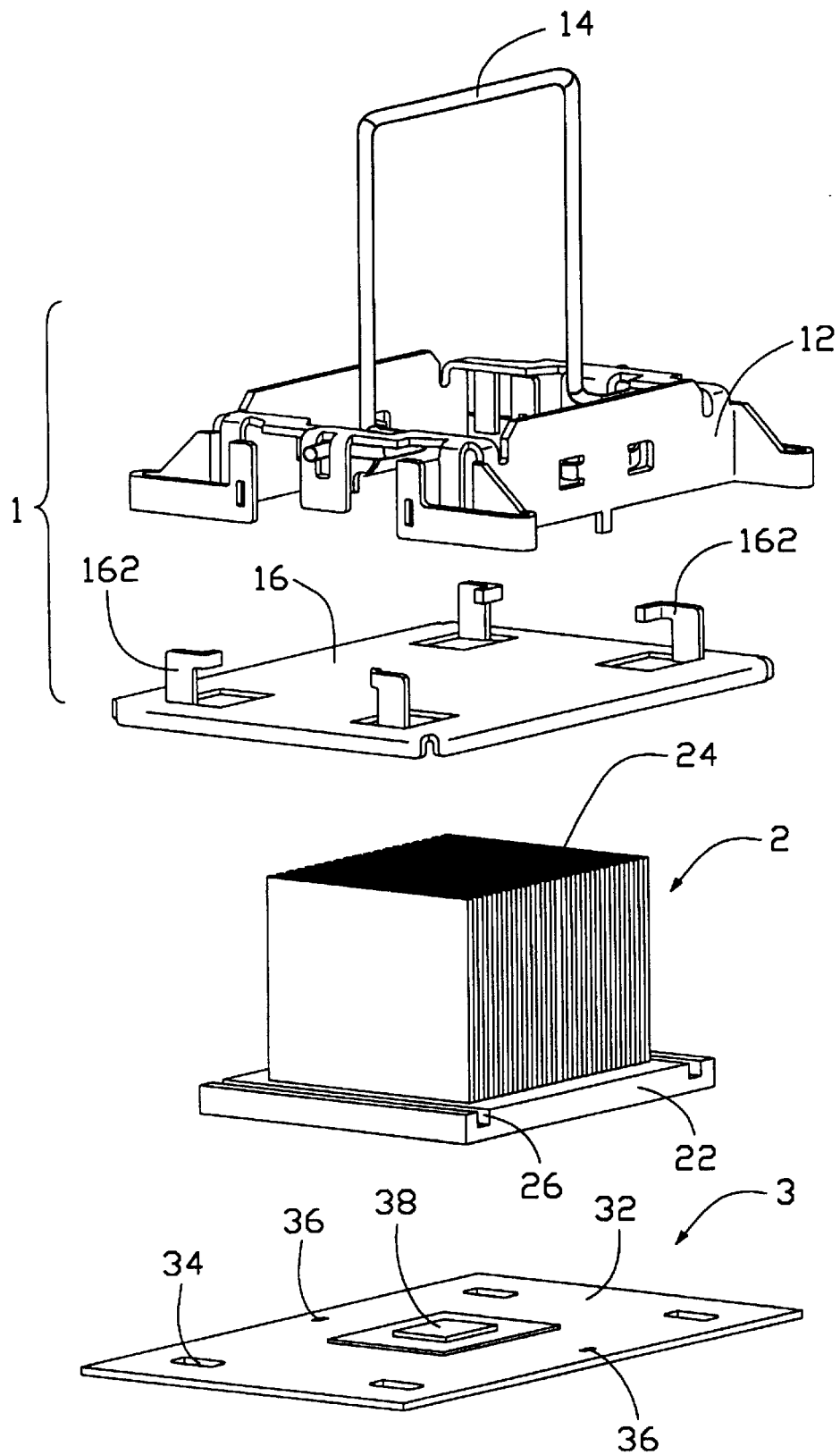
FIG. 1 is an exploded view of a retainer device in accordance with the preferred embodiment of the present invention, for fastening a heat sink to a printed circuit board module.

FIG. 1 shows a retainer device 1 of the present invention, together with a heat sink 2 and a printed circuit board module 3. The retainer device 1 includes a fastening frame 12, an operation lever 14, and a backing plate 16. The operation lever 14 is pivotally mounted to the fastening frame 12. The backing plate 16 has a plurality of clasp hooks 162, for engaging with the printed circuit board module 3.

The heat sink 2 includes a base plate 22 and a plurality of fins 24 attached to the base plate 22. The fins 24 and base plate 22 may be extruded as a single unit. The base plate 22 extends outwardly to form two side portions thereof at opposite sides of the fins 24. A groove 26 is defined in each side edge, for facilitating pressing of the retainer device 1 against the heat sink 2. The printed circuit board module 3 comprises a printed circuit board 32, and a central processing unit module 38 fastened on the printed circuit board 32. A plurality of positioning holes 34 and a pair of latch holes 36 are defined in the printed circuit board 32 around the central processing unit module 38. Another kind of memory module may be used instead of the central processing unit module 38.

Figure 3:
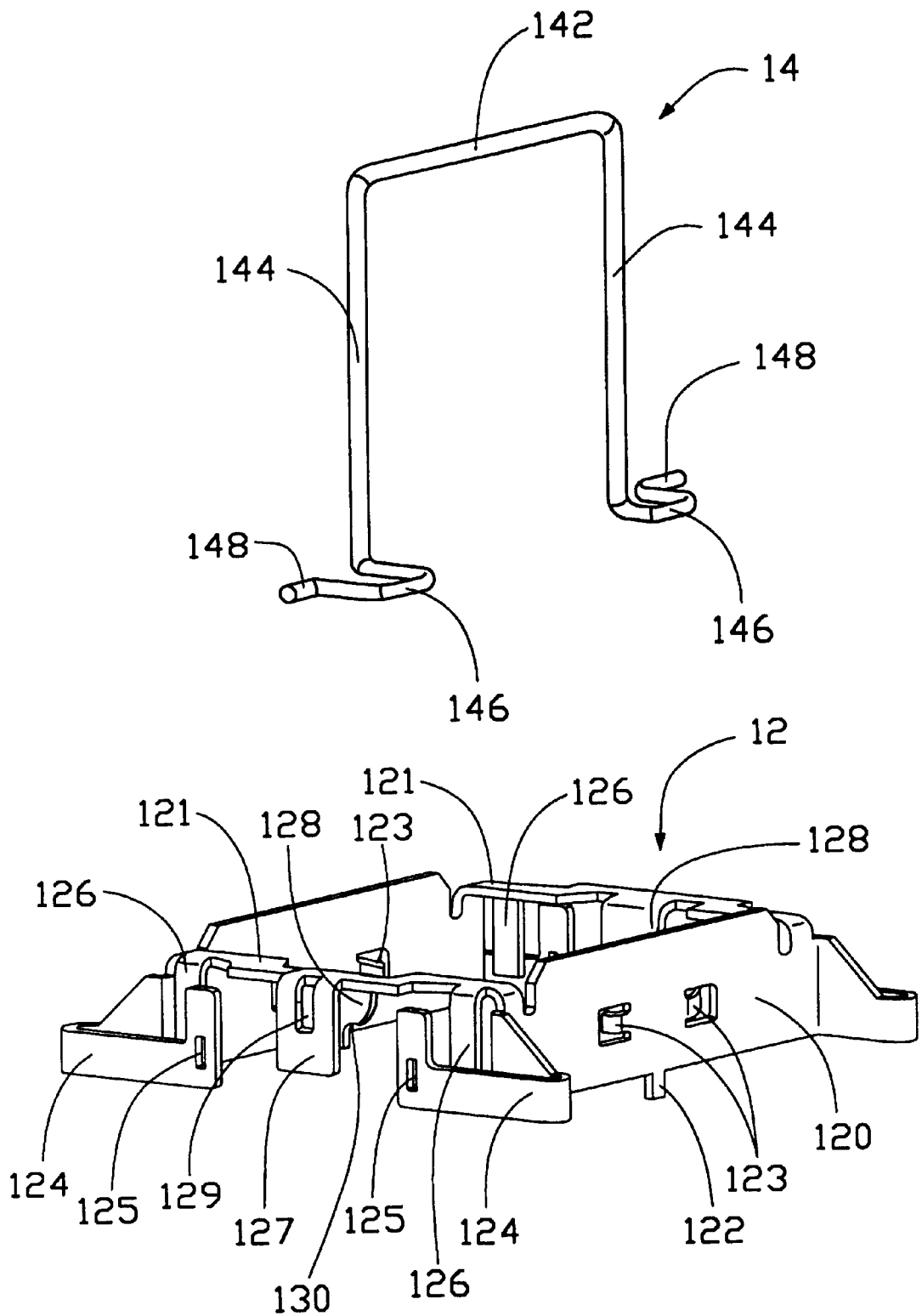
FIG. 3 is an exploded view of the operation lever and fastening frame of the retainer device of FIG. 1.
Figure 4:
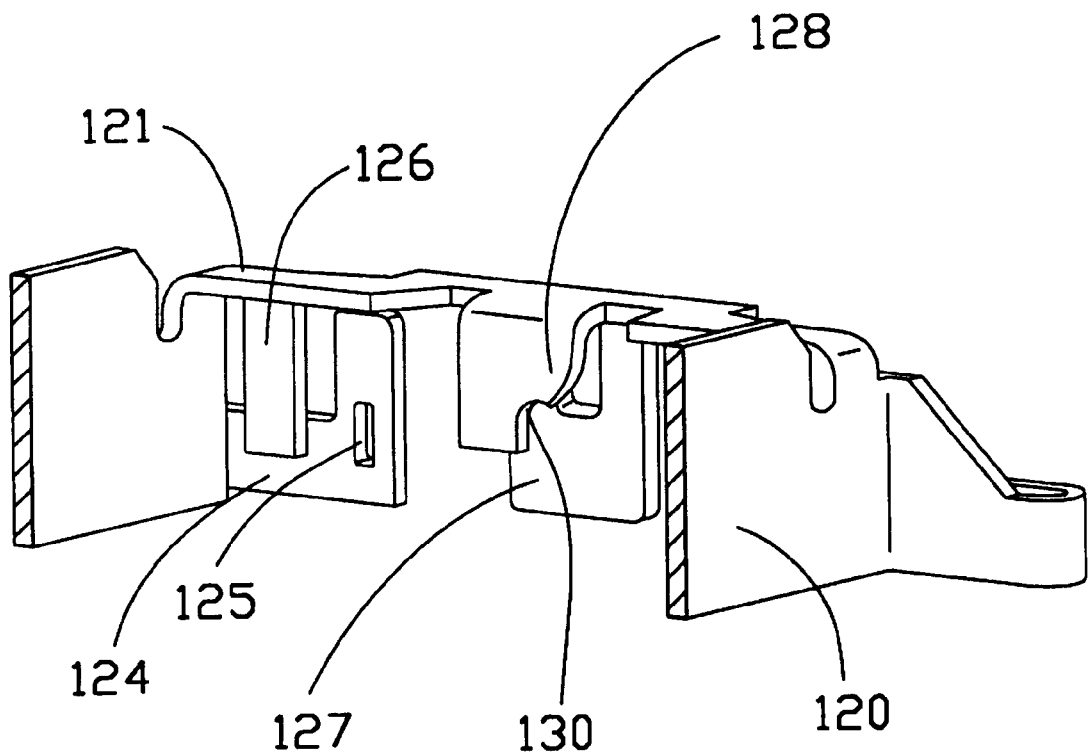
FIG. 4 is a cut-away perspective view of part of the fastening frame of FIG. 3.

Referring to FIG. 3, the fastening frame 12 has two opposite vertical sidewalls 120 and two opposite horizontal crossbeams 121. A locating latch 122 depends from a central portion of each sidewall 120. A pair of blocking posts 123 is inwardly formed from each sidewall 120. A generally U-shaped resilient leg 124 extends from each end of each sidewall 120, such that an end portion thereof generally opposes the corresponding crossbeam 121. A latch hole 125 is defined in the end portion of each resilient leg 124. A blocking plate 126 depends from each end of each crossbeam 121. A support plate 127 depends from an outer edge of a central portion of each crossbeam 121. A cam plate 128 depends from an inner edge of the central portion of each crossbeam 121, opposite the corresponding support plate 127. A pivot opening 129 is defined in each support plate 127. A cutout 130 is formed on the cam plate 128. As seen clearly in FIG. 4, an outward edge of the cam plate 128 is curved. The cutout 130 is located at the end of this curved edge, approximately at the bottom of the cam plate 128. The operation lever 14 includes an operational body 142, a pair of parallel arms 144 respectively depending from opposite ends of the operational body 142, a pair of U-shaped urging portions 146 respectively extending from bottom ends of the arms 144, and a pair of pivot axles 148 respectively extending outwardly from distal ends of the urging portions 146.

Figure 2:
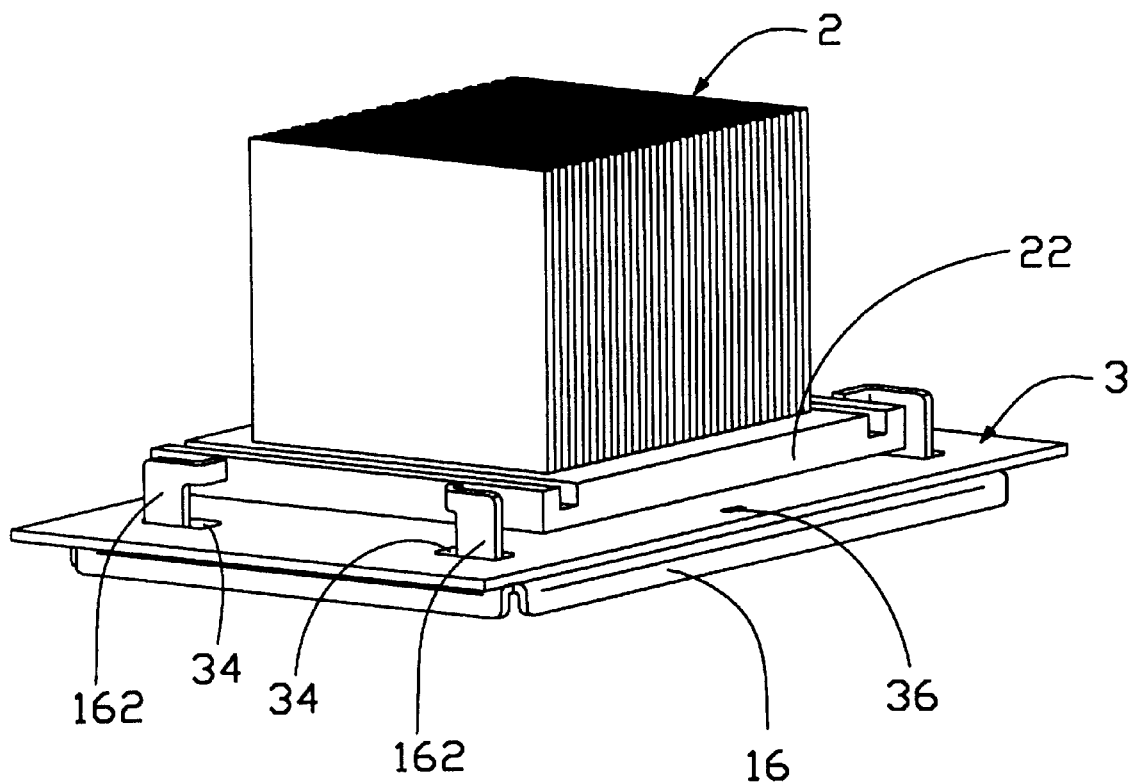
FIG. 2 is an assembled view of FIG. 1, but not showing an operation lever and fastening frame of the retainer device.

Referring to FIG. 2, in pre-assembly, the backing plate 16 is positioned at a bottom surface of the printed circuit board 32 of the printed circuit board module 3. The clasp hooks 162 of the backing plate 16 are inserted through the positioning holes 34 of the printed circuit board 32. The clasp hooks 162 thus protrude out from an upper surface of the printed circuit board 32, for clasping the fastening frame 12. The heat sink 2 is then mounted on an upper surface of the central processing unit module 38.

As shown in FIG. 1, in further pre-assembly, each pivot axle 148 of the operation lever 14 is passed through the corresponding pivot opening 129 of the fastening frame 12.

Figure 5:
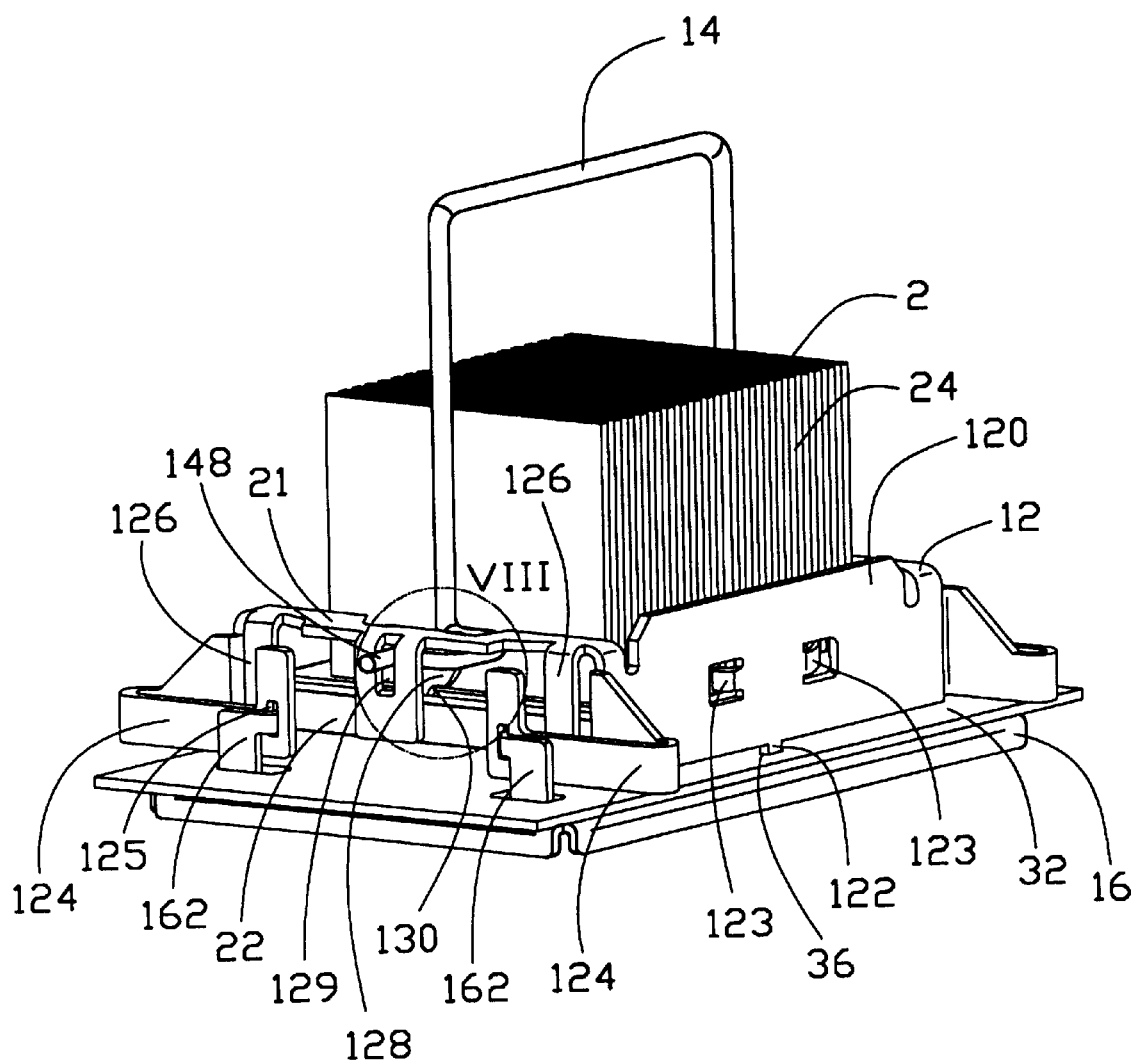
FIGS. 5, 6 and 7 are assembled views of FIG. 1, at progressive stages of rotation of the operation lever.

As seen in FIG. 5, in assembly, the combined fastening frame 12 and operation lever 14 are placed onto the heat sink 2 mounted on the central processing unit module 38. The locating latches 122 of the sidewalls 120 of the fastening frame 12 are inserted through the locating holes 36 of the printed circuit board 32, thereby properly locating the fastening frame 12 on the printed circuit board 32. A lower portion of each cam plate 128 is inserted into the corresponding groove 26 of the heat sink 2. Free ends of the resilient legs 124 are pressed inwardly, so that the clasp hook 162 of the backing plate 16 engage in the latch holes 125 of the resilient legs 124. During and after assembly, the blocking plates 126 of the crossbeams 121 of the fastening frame 12 prevent the base plate 22 of the heat sink 2 from moving in horizontal directions. The blocking posts 123 of the sidewalls 120 of the fastening frame 12 securely confine the fins 24 of the heat sink 2, and prevent lateral movement of the heat sink 2. Thus the retainer device 1 of the present invention securely clasps the heat sink 2 mounted on the printed circuit board module 3.

Figure 6:
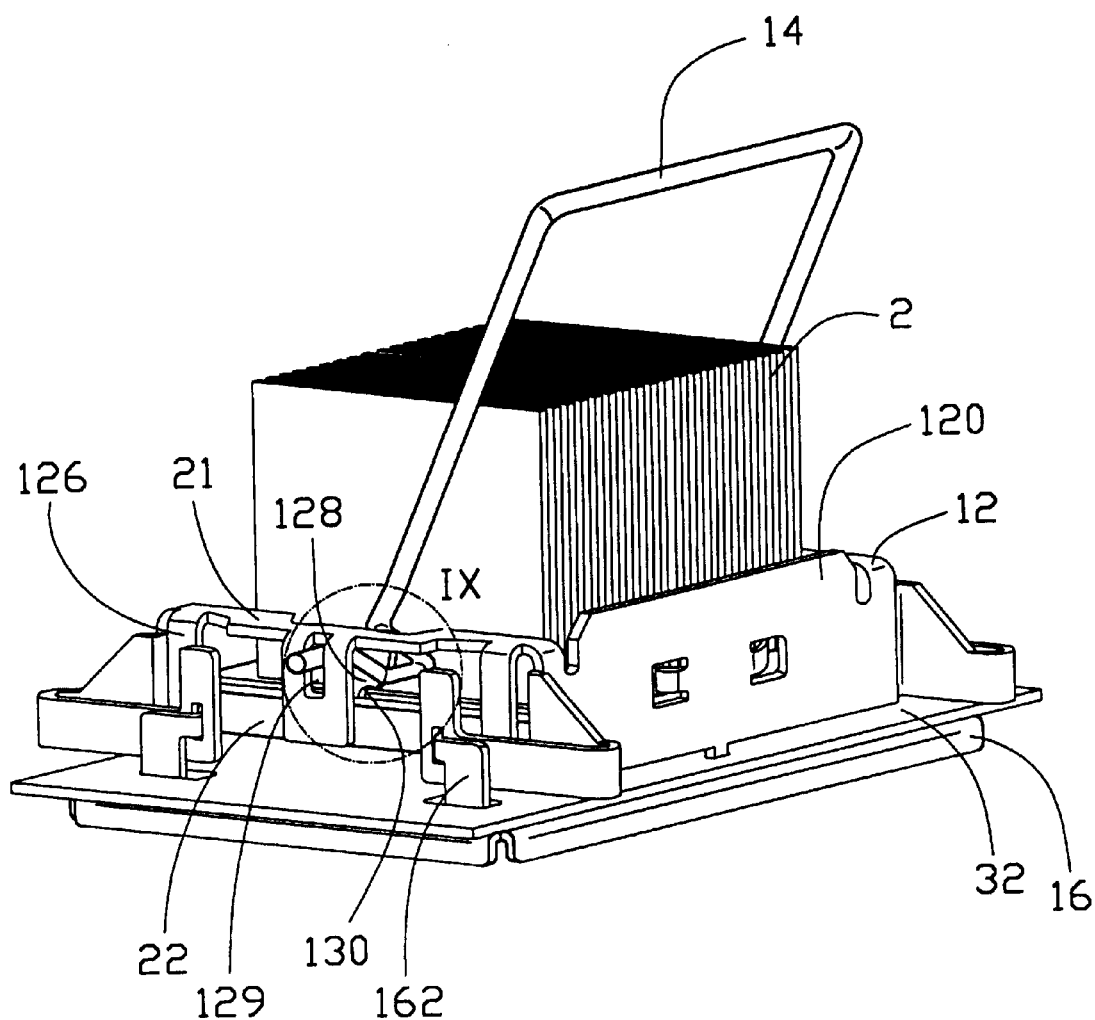
Figure 7:
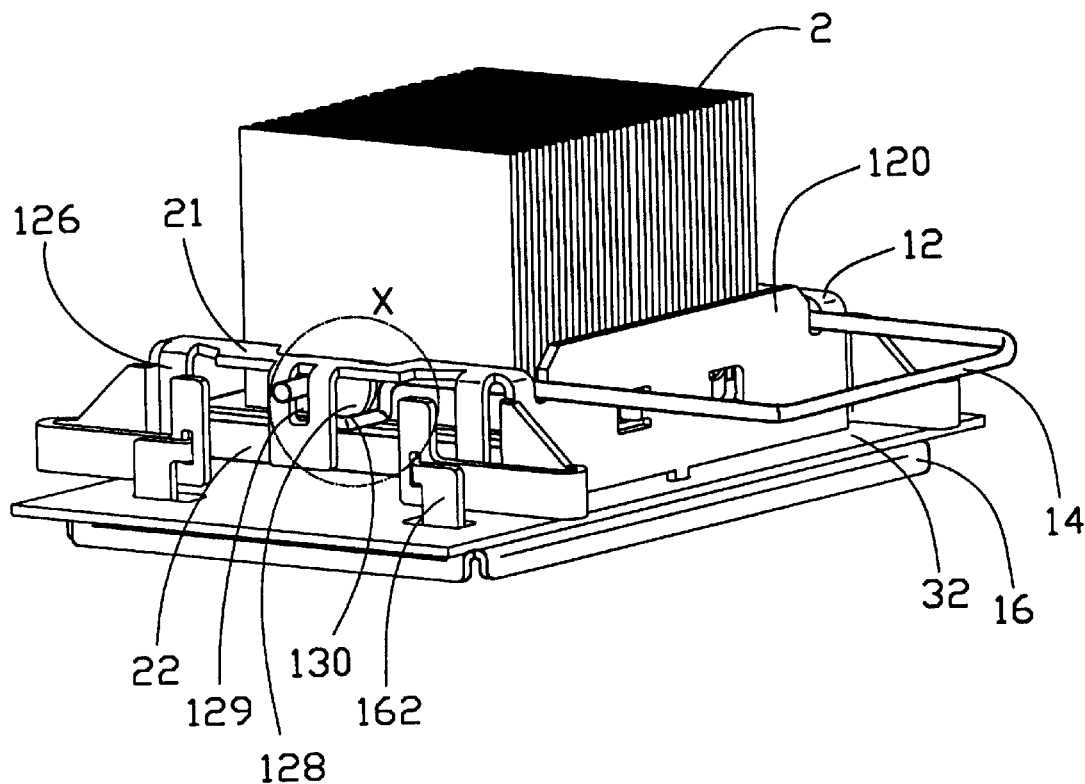

As shown in FIG. 6, in order to press the heat sink 2 against the central processing unit module 38, the operational body 142 of the operation lever 14 is rotated about the pivot axles 148 of the operation lever 14. The pivot axles 148 bear against the crossbeams 121 of the fastening frame 12 at upper extremities of the pivot openings 129 of the fastening frame 12. At the same time, the urging portions 146 of the operation lever 14 pass around the curved edge of the cam plate 128. The urging portions 146 subsequently snap into the cutouts 130 of the cam plates 128, simultaneously pressing the base plate 22 of the heat sink 2. Referring to FIG. 7, the arms 144 of the operation lever 14 are rotated to a horizontal position, at which point the urging portions 146 bear against lower portions of the cam plates 128. In this position, the urging portions 146 firmly press the base plate 22 of the heat sink 2.

Figure 8:
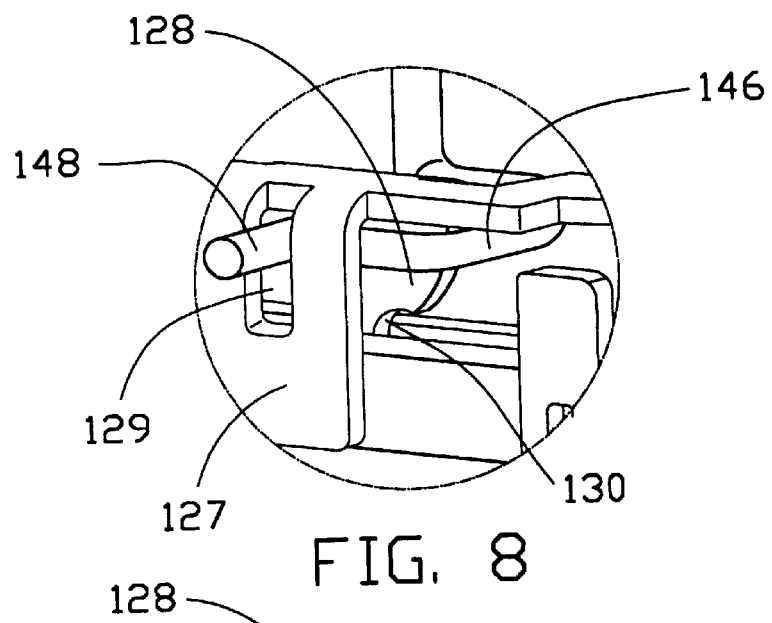
FIGS. 8, 9 and 10 are partial enlarged views of FIGS. 5, 6 and 7 respectively.
Figure 9:
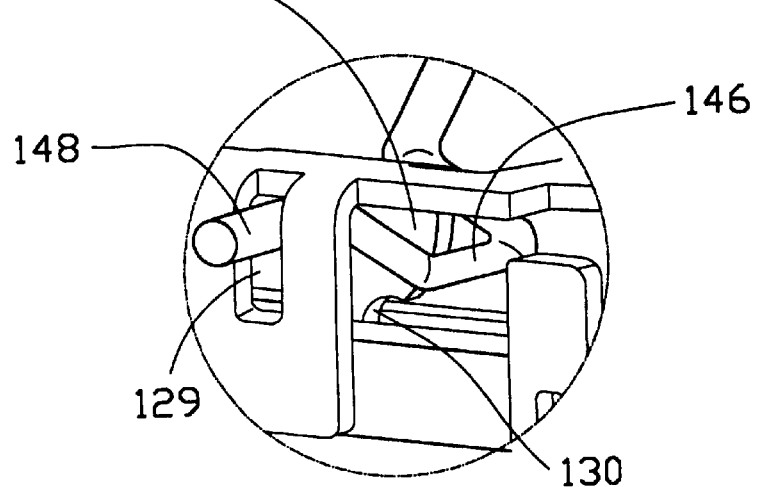
Figure 10:
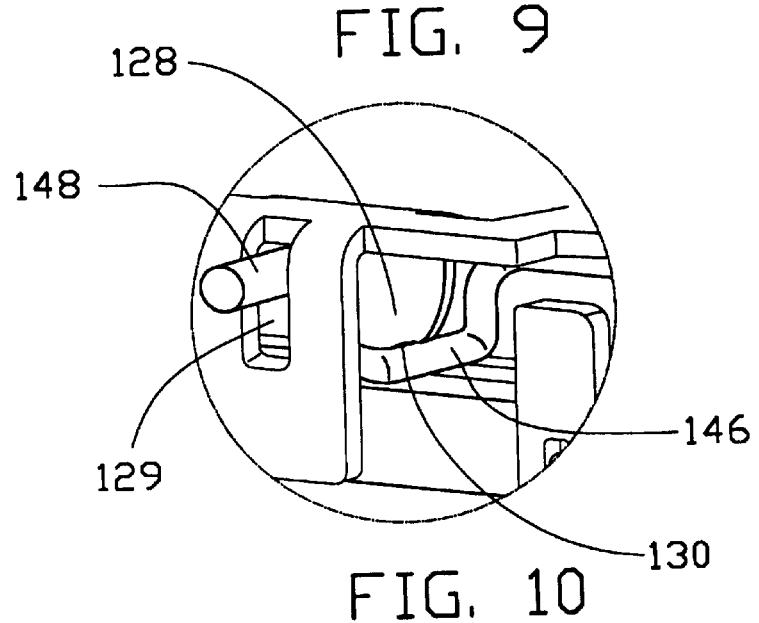

FIGS. 8, 9 and 10 show in sequence that each urging portion 146 initially lies near an upper end of the curved edge of the cam plate 128, that the urging portion 146 is then pivoted toward a lower end of the cam plate 128, and that the urging portion 146 finally enters the cutout 130 of the cam plate 128. The relatively long arms 144 of the lever 14 provide ample leverage, which makes it easy to perform the above operation. The urging portion 146 is firmly clasped in the cutout 130. The operation lever 14 is thereby prevented from accidentally disengaging from the fastening frame 12, under conditions of vibration for example.

Figure 11:
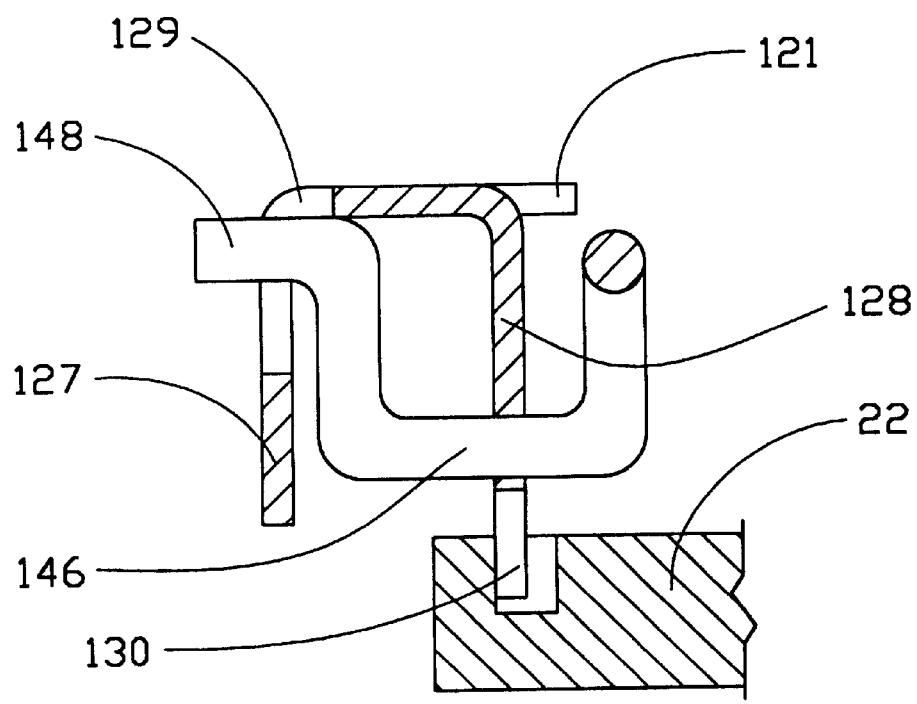
FIGS. 11 and 12 are partial cutaway views of the operation lever and fastening frame at progressive stages of rotation of the operation lever, showing the operational relationship between the retainer device and the heat sink.
Figure 12:
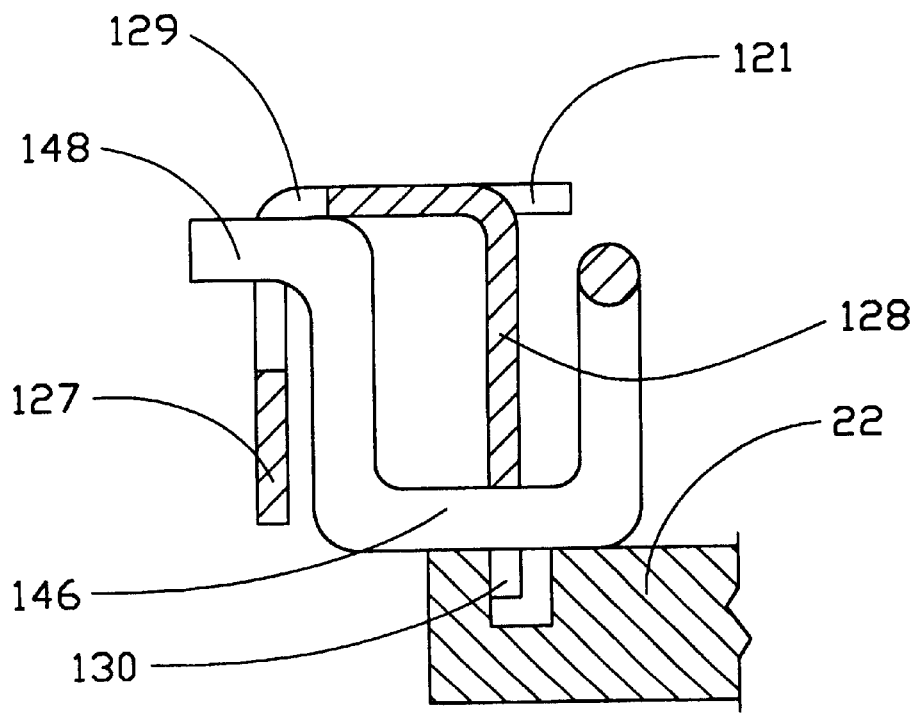

FIG. 11 corresponds generally to FIG. 9. As shown in FIG. 11, the pivot axle 148 of the operation lever 14 lies in the pivot opening 129. Before the urging portion 146 of the operation lever 14 contacts the base plate 22 of the heat sink 2, the lower portion of the cam plate 128 and the cutout 130 are substantially disposed in the groove 26 of the base plate 22 of the heat sink 2. FIG. 12 corresponds generally to FIG. 10. As seen in FIG. 12, the pivot axle 148 has been rotated so that the urging portion 146 contacts the base plate 22. When the pivot axle 148 is rotated further, it is forced to bear against the crossbeam 121 at the upper extremity of the pivot opening 129. The clasp hooks 162 of the backing plate 16 retain the resilient legs 124 of the fastening frame 12. Thus the pivot axle 148 forces the crossbeam 121 to resiliently move upward. This causes more of the cutout 130 to be disposed above the groove 26, and thus enables the urging portion 146 to fully enter the cutout 130. The pivot axle 148 can then be further rotated until the urging portion 146 bears against the lower portion of the cam plate 128. In this position, the lower portion of the cam plate 128 prevents the base plate 22 of the heat sink 2 from moving in a horizontal direction.

Other embodiments of the invention described above will be apparent to those having ordinary skill in the art. The present invention is not to be limited by the embodiment described but rather by reference to the appended claims.

What is claimed is:

1. A retainer device fastening a heat sink to a printed circuit board module, comprising:
    a backing plate disposed on one side of the printed circuit board module and forming a plurality of clasp hooks extending through the printed circuit board module;
    a fastening frame installed around a heat sink mounted on an opposite side of the printed circuit board module, the fastening frame forming a plurality of resilient legs engaging with the clasp hooks of the backing plate, and a plurality of support plates; and
    an operation lever including an operational body, a plurality of arms connected to the operational body, a plurality of urging portions each connected to the corresponding arm, and a plurality of pivot axles respectively pivotally attached to the support plates of the fastening frame, each of said urging portions being moveable with the operational body and the corresponding arm about the corresponding pivot axle and snapped into a cutout of a corresponding cam member for pressing the heat sink against the printed circuit board module.

2. The retainer device of claim 1, wherein the cam member has an edge for facilitating movement of the corresponding urging portion.

3. The retainer device of claim 1, wherein each of the support plates has a void for receiving the corresponding pivot axle.

4. The retainer device of claim 1, wherein the fastening frame comprises a plurality of side members and a plurality of cross members.

5. The retainer device of claim 1, wherein the fastening frame further comprises at least one blocking portion securely confining fins of the heat sink.

6. The retainer device of claim 1, wherein the fastening frame further comprises at least one locating portion depending downward through the printed circuit board module.

7. A heat sink assembly for being mounted on a circuit board module, comprising:
    a heat sink having a base plate mounted on a top side of the circuit board module and a plurality of fins extending upwardly from a top surface of the base plate; and
    a retainer device for retaining the heat sink to the circuit board module and including a backing plate disposed on a bottom side of the printed circuit board module, the printed circuit board module having a plurality of positioning voids, and the backing plate having a plurality of clasping members extending through the corresponding positioning voids of the module, the retainer device further including a fastening frame installed around the heat sink on an opposite side of the printed circuit board module and clasped by the backing plate, the fastening frame including an operation lever, the operation lever including an operational body, a plurality of arms extending downward from the operational body, a plurality of pivot axles pivotally engaging with the fastening frame and a plurality of urging portions connecting the pivot axles and the arms, the operation lever being rotatable about the pivot axles to cause the urging portions to move to press the base plate of the heat sink under a condition that the clasping members respectively engage corresponding locking holes of the fastening frame in tension so as to have the base plate of the heat sink and the printed circuit board module abut against each other.

8. The heat sink,assembly of claim 7, wherein each urging portion has a generally U-shaped configuration.

9. The heat sink assembly of claim 7, wherein the fastening frame comprises a plurality of side members and a plurality of cross members connecting with the side members.

10. The heat sink assembly of claim 7, wherein the fastening frame further comprises at least one locating member depending downward through the printed circuit board module and at least one blocking member securely confining fins of the heat sink.

11. A heat sink assembly comprising:
    a printed circuit board module with a CPU on an upper side thereof;
    a backing plate positioned on an underside of said module;
    a heat sink positioned on the CPU; and
    a fastening frame positioned on said upper side of the printed circuit board module and surrounding the heat sink, said fastening frame secured to the backing plate to sandwich the module therebetween, a pivotal lever positioned on the fastening frame, said pivotal lever including an urging portion which is spaced from the heat sink when the pivotal lever is in an upstanding position while abuts against the heat sink when the pivotal lever is in a horizontal position.

12. The assembly as claimed in claim 11, wherein the fastening frame includes a camming plate inserted into the heat sink, along which said urging portion is moved during rotation of the lever.

* * * * *